United States Patent [19]

Ienaka

[11] 4,356,350

[45] Oct. 26, 1982

[54] FM RECEIVER

[75] Inventor: Masanori Ienaka, Kodaira, Japan

[73] Assignee: Hitachi, Ltd., Tokyo, Japan

[21] Appl. No.: 162,087

[22] Filed: Jun. 23, 1980

[30] Foreign Application Priority Data

Sep. 21, 1979 [JP] Japan .................................. 54-120648

[51] Int. Cl.³ ............................................... H04H 5/00
[52] U.S. Cl. ............................... 179/1 GJ; 179/1 GE
[58] Field of Search ............. 179/1 GJ, 1 GM, 1 GE,
179/1 GN; 369/86, 88; 329/167, 50

[56] References Cited

U.S. PATENT DOCUMENTS

| 3,634,626 | 1/1972 | Staley | 179/1 GM |
|---|---|---|---|
| 3,673,342 | 6/1972 | Muller | 179/1 GJ |
| 3,823,268 | 7/1974 | Modafferi | 179/1 GJ |
| 4,032,717 | 6/1977 | Mallon | 179/1 GJ |
| 4,037,057 | 7/1977 | Ogita et al. | 179/1 GJ |

FOREIGN PATENT DOCUMENTS

| 1939422 | 2/1971 | Fed. Rep. of Germany . | |
| 2950485 | 8/1980 | Fed. Rep. of Germany . | |
| 55-86235 | 6/1980 | Japan | 179/1 GJ |
| 2040145 | 8/1980 | United Kingdom | 179/1 GJ |

OTHER PUBLICATIONS

"Theorie und Anwendungen des Phase-Locked Loops", von Roland Best, Elektroniker, 11/1976, pp. 18-25.

"Service an Stereo-Decodern", U. Prestin, Funk-Technik, 1964, pp. 660-661.
"Integrierte Schaltungen für Stereo-Decoder", R. Jagberger, Funk-Technik, 1971, Nr. 15, pp. 549-553.

Primary Examiner—Douglas W. Olms
Attorney, Agent, or Firm—Antonelli, Terry & Wands

[57] ABSTRACT

Stereo composite signals and 38 KHz sub-carrier switching signal are fed to a stereo demodulator. The 38 KHz sub-carrier switching signal is generated from the phase-lock loop circuit and is transmitted to the stereo demodulator circuit via a gain-controlled circuit.

The output of an FM detector is applied to a high-pass filter which works to take out undesirable high-frequency components that are contained in the FM detection outputs. The level of the high-frequency components is detected by a detector.

The output signal of the detector is applied to the gain-controlled circuit to control the gain of the gain-controlled circuit. When the level of undesirable high-frequency components obtained by the high-pass filter increases, the gain of the gain-controlled circuit is decreased, whereby the amplitude level of 38 KHz sub-carrier switching signal transmitted to the stereo demodulator is lowered.

Thus, it is possible to suppress the development of beat signals of audible frequencies, due to the interference between undesirable high-frequency components contained in the outputs of the FM detector and harmonic components in the 38 KHz sub-carrier signals.

4 Claims, 1 Drawing Figure

FM RECEIVER

BACKGROUND OF THE INVENTION

The present invention relates to an FM receiver for controlling stereo separation.

In an FM receiver, a portion of the carrier waves, which is phase-modulated by noise waves, is detected by an FM detector and is converted into a noise output. The magnitude by which the carrier waves are phase-modulated by noise waves varies depending upon a difference in the carrier wave frequency and the noise frequency. When the noise waves are uniformly distributed, the magnitude increases in proportion to the frequency. This characteristic is referred to as the triangular noise characteristic in the frequency modulation.

In FM stereo demodulation, there is greater deterioration in the signal-to-noise ratio (S/N ratio) by the noise contained in a frequency band of sub-channel signals in which stereo composite signals have frequencies of 23 KHz to 53 KHz, than in the monaural demodulation in which a portion surrounded by a small triangle of up to 15 KHz in an audible range produces a noise output.

When the receiver is placed in an electromagnetic field established by a weak input in which the amplitude limiting effect is diminished, the signal-to-noise ratio is reduced by the amplitude modulation component and the phase modulation. During the period of stereo demodulation, therefore, the signal-to-noise ratio is strikingly deteriorated by noise which is distributed over the above-mentioned wide ranges.

Japanese Patent Laid-Open No. 17604/1976 discloses a method of preventing the sound quality from deterioration by automatically switching between FM stereo and monaural demodulation depending upon the noise level in the output of the FM detector, or by automatically switching between the FM stereo and monaural demodulation by detecting the intensity of the input field strength relying upon the output level of the FM intermediate-frequency amplification.

According to the above-mentioned known method, switching between the FM stereo and monaural demodulation is automatically accomplished by forming a variable filter using a resistor, a capacitor and a control transistor, by controlling the conductive state of the control transistor, and by controlling the amount of attenuation of the high-frequency components. However, since the above conventional FM receiver requires the capacitor to form the variable filter, difficulty is encountered when it is attempted to construct the FM receiver in the form of a monolithic semiconductor integrated circuit.

When switching between the stereophonic reproduction and monaural reproduction in an FM receiver which will be subjected to great and frequent changes in the input electric field strength such as in the case of car radios, however, instantaneous and frequent change between the stereophonic reproduction and the monaural reproduction results in the reproduction of offensive sounds. In order to eliminate such a defect, therefore, the inventor of the present invention has previously proposed a method to continuously change the stereo separation by continuously changing the level of 38 KHz switching signals applied to an FM stereo demodulator in the switching system, depending upon the intensity in the input electromagnetic field. (Japanese Patent Application No. 8237/1979, filed Jan. 29, 1979; U.S. patent application Ser. No. 098,235, filed Nov. 28, 1979; British Patent Application No. 79.41976, filed Dec. 5, 1979; German Patent Application P.2950485.6, filed Dec. 14, 1979; Italian Patent Application No. 19515A/80, filed Jan. 28, 1980).

With reference to the above-proposed control system, however, it was clarified by the inventor of the present invention that the stereo separation varies irrespective of the change in the noise level of FM demodulated signals due to dispersion in the FM front end characteristics and dispersion in the gain of an intermediate-frequency amplifier circuit, and the signal-to-noise ratio of the signals reproduced under an input field strength which is expected to attain a predetermined stereo separation, varies responsive to the dispersion. Namely, with the aboveproposed control system, it is difficult to so control the stereo separation that the signal-to-noise ratio of the resulting signals becomes greater than a predetermined value.

Furthermore, beat components which fall outside the audible ranges and which are caused by signal interference between the two FM broadcasting signals of close frequencies are contained in the FM detection signals. Such beat components are often beat down by harmonics of switching signals of 38 KHz which are employed for the FM stereophonic demodulator, and are converted into audible frequencies. The aboveproposed system, however, is not capable of avoiding such inconvenience.

SUMMARY OF THE INVENTION

The object of the present invention is to provide an FM receiver which is capable of reducing noise due to the beat down in the FM stereo demodulator.

According to the fundamental feature of the present invention to accomplish the above object, the FM detection outputs are allowed to pass through a high-pass filter, whereby high-frequency noise components only are taken out and are converted into a D-C component to utilize them as signals for controlling the stereo separation.

DESCRIPTION OF THE PREFERRED EMBODIMENT

Figure 1:
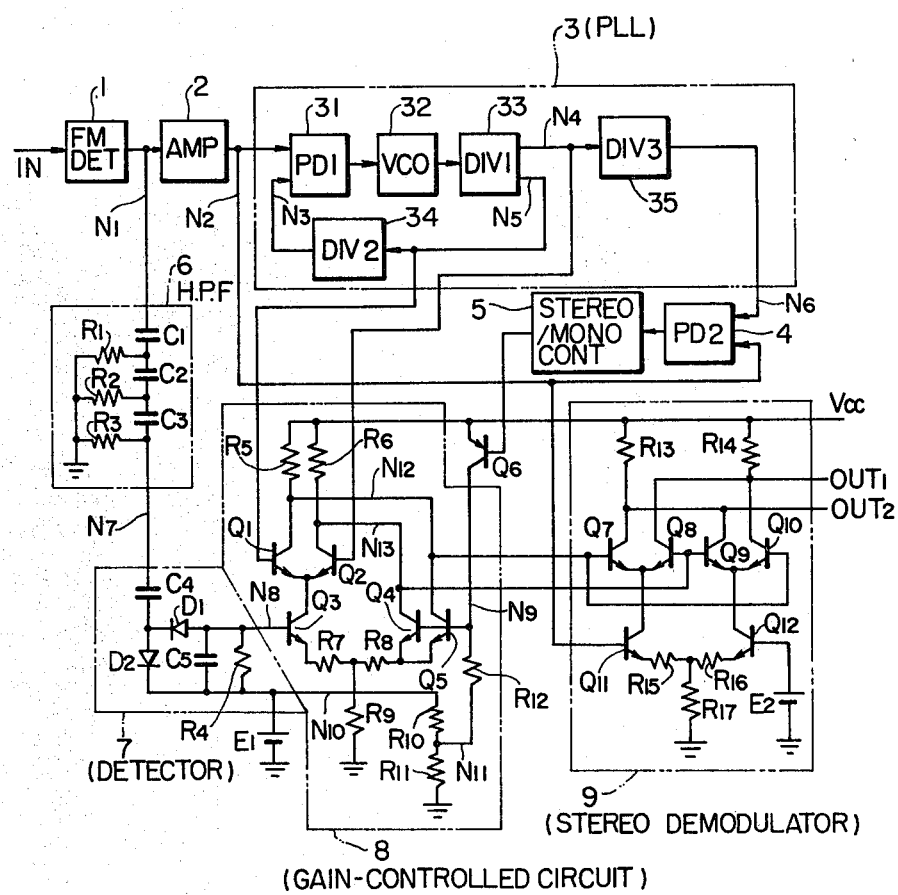
FIG. 1 is a circuit diagram of an embodiment according to the present invention.

FIG. 1 is a circuit diagram illustrating an embodiment according to the present invention.

In FIG. 1, reference numeral 1 denotes an FM detector which produces an FM detection signal at a nodal point $N_1$ upon receipt of an FM intermediate-frequency signal which is supplied from an intermediate-frequency amplifier that is not shown. When a stereophonic broadcast is received, the FM detection signal consists of a composite signal made up of a main-channel signal, a sub-channel signal which is modified by a 38 KHz sub-carrier signal, and a 19 KHz pilot signal. On the other hand, when a manaural broadcast is received, the FM detection signal consists of the main-channel signal alone.

Reference numeral 2 denotes an amplifier for amplifying the FM detection signal.

Reference numeral 3 denotes a phase-lock loop (PLL) circuit, which consists of a phase detector 31, a voltage-controlled oscillator 32 having a free-running oscillation frequency of approximately 76 KHz, and dividers 33 and 35 having a frequency-dividing ratio of one-half, respectively. When the stereophonic broadcast is received, the PLL circuit 3 operates in synchronism with pilot signals of 19 KHz in the FM detection signals applied to a nodal point $N_2$ and produces 38 HKz sub-carrier signals of opposite phases at nodal points $N_4$ and $N_5$ and a 19 KHz signal at a nodal point $N_6$. When the monaural broadcast is received, signals of a frequency determined by the oscillation frequency of the voltage-controlled oscillator 32 are produced at the nodal points $N_4$ to $N_6$.

Reference numeral 4 denotes a phase detector which detects pilot signals reproduced during the reception of a stereophonic broadcast upon receipt of the 19 KHz signal from the nodal point $N_6$ of the PLL circuit 3 and upon receipt of the FM detection signal from the nodal point $N_2$ of the amplifier 2.

Reference numeral 5 denotes a stereo/monaural switching control circuit which is responsive to the output signals from the phase detector circuit 4 and which produces a control signal to render a transistor $Q_6$ conductive when the monaural broadcast is being received, and to render the transistor $Q_6$ non-conductive when the stereophonic broadcast is being received.

Such a PLL circuit has been reported in a journal "ELECTRONICS", pp. 62-66 published in November, 1971.

To control the stereo separation, the embodiment of the present invention is equipped with a high-pass filter 6, a level detector 7 and a gain-controlled circuit 8, such that the level of 38 KHz sub-carrier signals supplied to a stereo demodulator 9 of the switching system is controlled.

Although not specifically limited, the high-pass filter 6 consists of capacitors $C_1$ to $C_3$ and resistors $R_1$ to $R_3$, selects high-frequency components in the FM detection signals introduced from the nodal point $N_1$, and produces outputs at a nodal point $N_7$. In order that the level detector 7 which will be mentioned below is not affected by the sub-channel signals in the 23 KHz to 53 KHz band, the high-pass filter 6 has a cut-off frequency which is greater than 53 KHz which is the upper-limit frequency of the sub-channel signals. Although there is no particular limitation, the cut-off frequency of the high-pass filter 6 is set to be about 60 KHz.

The detector 7 consists of a coupling capacitor $C_4$, rectifier diodes $D_1$ and $D_2$, a smoothing capacitor $C_5$ and a resistor $R_4$.

As illustrated in FIG. 1, the resistor $R_4$ and the smoothing capacitor $C_5$ are connected in parallel between a nodal point $N_8$ and a nodal point $N_{10}$, the anode of the diode $D_1$ is connected to the nodal point $N_8$, the cathode of the diode $D_1$ is connected to one terminal of the coupling capacitor $C_4$ and to the anode of the diode $D_2$, and the cathode of the diode $D_2$ is connected to the nodal point $N_{10}$ which is connected to a d-c bias source $E_1$.

Therefore, a d-c potential at the nodal point $N_8$ assumes a negative potential relative to a d-c potential at the nodal point $N_{10}$ by a value corresponding to the amplitude of high-frequency noise signals supplied to the nodal point $N_7$. When the level of high-frequency noise signals supplied to the nodal point $N_7$ is substantially 0, the potentials at the nodal points $N_8$ and $N_{10}$ become substantially equal to each other as determined by the d-c bias source $E_1$.

The gain-controlled circuit 8 consists of resistors $R_5$ to $R_{12}$, and transistors $Q_1$ to $Q_5$.

The base of the transistor $Q_1$ is connected to the nodal point $N_5$ of the PLL circuit 3, and its collector is connected to a nodal point $N_{12}$. The base of a transistor $Q_2$ is connected to the nodal point $N_4$ of the PLL circuit 3, and its collector is connected to a nodal point $N_{13}$. Emitters of the transistors $Q_1$ and $Q_2$ are connected to the collector of a transistor $Q_3$ so that the transistors $Q_1$ and $Q_2$ operate in a differential manner. The resistors $R_5$ and $R_6$ are connected between each of the nodal points $N_{12}$ and $N_{13}$ and a power supply terminal Vcc, the base of the transistor $Q_3$ is connected to the nodal point $N_8$, and the emitter of the transistor $Q_3$ is connected to one end of a resistor $R_9$ via a resistor $R_7$.

Bases of transistors $Q_4$ and $Q_5$ are commonly connected to the nodal point $N_9$, and their emitters are commonly connected to each other. The above commonly connected emitters are connected to one end of the resistor $R_9$ via a resistor $R_8$.

Collectors of the transistors $Q_4$ and $Q_5$ are connected to their corresponding nodal points $N_{13}$, $N_{14}$, respectively.

The transistors $Q_4$ and $Q_5$ have the same construction so that they will permit equal collector current to flow responsive to a bias across the common bases and the common emitters.

Owing to the above-mentioned construction, the transistors $Q_3$, $Q_4$ and $Q_5$ operate in a differential manner responsive to a potential difference between the nodal point $N_8$ and the nodal point $N_9$.

Resistors $R_{10}$ and $R_{11}$ are connected in series between the nodal point $N_{10}$ and ground point of the circuit to constitute a voltage-dividing circuit. A resistor $R_{12}$ is connected between a nodal point $N_{11}$ to which the resistors $R_{10}$, $R_{11}$ are connected and the nodal point $N_9$.

If the resistance ratio of the resistor $R_{10}$ to the resistor $R_{11}$ is suitably selected, the nodal point $N_{11}$ produces such a d-c bias voltage that renders the transistors $Q_4$ and $Q_5$ non-conductive and the transistor $Q_3$ conductive when the level of high-frequency noise signals at the nodal point $N_7$ is approximately zero.

The stereo demodulator 9 consists of resistors $R_{13}$ to $R_{17}$, transistors $Q_7$ to $Q_{10}$, and a d-c bias source $E_2$.

A similar stereo demodulator has been reported in IEEE TRANSACTIONS ON BROADCAST AND TELEVISION RECEIVERS, Vol. BTR-14, No. 3, pp. 58–73, issued October, 1968.

Switching signals of 38 KHz are supplied from the nodal points $N_{12}$, $N_{13}$ to the base of the transistors $Q_7$ to $Q_{10}$, and FM detection signals are supplied from the nodal point $N_2$ to the base of the transistor $Q_{11}$.

With the thus constructed circuit, the transistor $Q_6$ is rendered non-conductive when the stereophonic broadcast is being received.

Therefore, a d-c bias voltage determined by the resistors $R_{10}$ and $R_{11}$ is supplied to the nodal point $N_9$ of the gain-controlled circuit 8.

When the level of high-frequency noise signals produced by the high-pass filter 6 appearing at the nodal point $N_7$ is so small that it can be regarded as being almost zero, the potential at the nodal point $N_8$ is approximately equal to the potential at the nodal point $N_{10}$.

Accordingly, the transistor $Q_3$ is rendered conductive, and the transistors $Q_4$ and $Q_5$ are rendered non-conductive.

With the transistor $Q_3$ being rendered conductive, a sufficient operation current is allowed to flow into the transistors $Q_1$, $Q_2$ of which the bases are served with 38 KHz switching signals as sub-carrier signals.

Owing to the above-mentioned transistors $Q_1$ and $Q_2$, 38 KHz switching signals of a sufficiently high level are generated at the nodal points $N_{12}$, $N_{13}$.

Therefore, the stereo demodulator 9 produces stereo demodulation signals of a sufficiently larger degree of separation through its pair of output terminals $OUT_1$ and $OUT_2$.

A d-c potential at the nodal point $N_8$ decreases with the increase in the level of high-frequency noise signals at the nodal point $N_1$.

A current starts to flow into the transistors $Q_4$ and $Q_5$ with the decrease in the d-c potential at the nodal point $N_8$, whereby the current through the transistor $Q_3$ starts to decrease. Consequently, the amplitude of the sub-carrier switching signals of 38 KHz which are generated by the transistors $Q_1$ and $Q_2$ and generated at the nodal points $N_{12}$, $N_{13}$ is decreased.

The separation degree of the stereo demodulation signals produced from the stereo demodulator 9 decreases with the decrease in the level of switching signals at the nodal points $N_{12}$ and $N_{13}$. Here, the d-c potentials at the nodal points $N_{12}$, $N_{13}$ are maintained nearly constant, since voltage drops develop across the resistors $R_6$ and $R_5$ due to the currents of the transistors $Q_4$ and $Q_5$.

As the level of high-frequency noise signals becomes sufficiently great at the nodal point $N_7$, the d-c potential at the nodal point $N_8$ is decreased correspondingly, whereby the transistor $Q_3$ is rendered non-conductive.

When the transistor $Q_3$ is rendered non-conductive, the operation currents of the transistors $Q_1$ and $Q_2$ become zero. Hence, 38 KHz switching signals do not substantially appear on the nodal points $N_{12}$, $N_{13}$.

Therefore, the stereo demodulator 9 substantially ceases to exhibit the stereo demodulation function. In other words, monaural signals are reproduced at the output terminals $OUT_1$ and $OUT_2$.

When the monaural broadcast is being received, the transistor $Q_6$ is rendered conductive as mentioned earlier.

The potential at the nodal point $N_9$ of the gain-controlled circuit 8 is maintained at a relatively large value owing to the transistor $Q_6$ which is rendered conductive. Therefore, the transistor $Q_3$ is rendered non-conductive, and switching signals of 38 KHz cease to appear on the nodal points $N_{12}$ and $N_{13}$ exactly as in the above-mentioned case.

In the above-mentioned embodiment, the level of high-frequency noise signals at which the degree of separation starts to decrease, will be obvious from the aforementioned description of operation. The level, however, can also be changed by varying the voltage dividing ratio of the resistor $R_{10}$ to the resistor $R_{11}$.

The rate of decrease in separation with respect to the level of high-frequency noise signals can be determined by resistances of the resistors $R_7$ and $R_8$.

In the circuit of this embodiment, since noise in the band of signal frequencies and noise of higher frequencies establish a correlation as determined by the FM triangular noise characteristics, noise in the band of signal frequencies can be detected by detecting the high-frequency noise.

Since the separation degree is controlled by directly detecting the magnitude of noise contained in the FM detection outputs, therefore, it is possible to control the degree of separation maintaining accuracy without being affected by the dispersions in the FM front end and the intermediate-frequency amplifier.

With the degree of separation being decreased by decreasing the level of 38 KHz sub-carrier switching signals which are fed to the stereo demodulator 9 as in the embodiment of the present invention, even when harmonic components of a frequency of, for example, 100 KHz are contained in the FM detection signals, beat signals, which are produced by the multiplication of the sub-carrier switching signals by the harmonic components, in the band of audible frequencies can be attenuated.

Namely, beat components in the high-frequency 150 KHz to 450 KHz frequency band appear in the outputs of the FM detector due to the interference of primary signal interference between the two FM broadcasting stations of very close broadcasting frequencies. Previously, offensive beat signals in the band of audible frequencies were produced in the outputs of the stereo demodulator due to the secondary signal interference between the beat components in the high-frequency band and harmonic components of the order of odd numbers (i.e., 114 KHz, 190 KHz, ...) in the 38 KHz sub-carrier signals.

According to the present invention, the above-mentioned problem can be suppressed since the gain-controlled circuit 8 decreases the amplitude level of the 38 KHz sub-carrier switching signals fed to the stereo demodulator 9 with the increase in the level of high-frequency components of frequencies of greater than 100 KHz in the outputs of the FM detector 1.

Furthermore, with reference to the embodiment shown in FIG. 1, signals are transmitted from PLL circuit 3 through gain-controlled circuit 8 to stereo demodulator 9 in a d-c coupling manner. Therefore, the PLL circuit 3, gain-controlled circuit 8 and stereo demodulator 9 can be easily formed in a single semiconductor silicon chip of a monolithic semiconductor integrated circuit.

The present invention is in no way limited to the above-mentioned embodiment only. For example, the high-pass filter 6 may be a band-pass filter such as a mechanical filter. Signals from the amplifier 2 may be supplied to the high-pass filter 6.

The detector circuit 7, the gain-controlled circuit 8 and the like may be replaced by the circuits which have similar functions.

What is claimed is:

1. An FM receiver comprising:
    an FM detector;
    a stereo demodulator which receives a main-channel signal and a sub-channel signal of a stereo composite signal obtained from an output terminal of said FM detector, as well as a 38 KHz sub-carrier signal;
    a gain-controlled circuit which transmits said 38 KHz sub-carrier signal to said stereo demodulator;
    a high-pass filter for obtaining high-frequency components in an output signal of said FM detector; and
    a level detector for detecting the level of said high-frequency components that are obtained from said high-pass filter,
    wherein the output signal of said level detector is transmitted to said gain-controlled circuit, and the amplitude level of said 38 KHz sub-carrier signal applied by said gain-controlled circuit to said stereo demodulator is gradually lowered in accordance with a rise in the level of said high-frequency components that are obtained from said high-pass filter.

2. An FM receiver according to claim 1, wherein a cut-off frequency of said high-pass filter is selected to such a value that said level detector is not substantially affected by the sub-channel signal of the stereo composite signal.

3. An FM receiver according to claim 2, wherein said-controlled circuit consists of a first transistor, a second transistor and a third transistor, the emitter of said first transistor and the emitter of said second transistor are commonly connected to the collector of said third transistor, at least either one of the base of said first transistor or the base of said second transistor is driven by said 38 KHz sub-carrier signal, the base of said third transistor is supplied with the output signal of said level detector, and said stereo demodulator is supplied with the 38 KHz sub-carrier signal which are produced on at least either one of the collector of said first transistor or the collector of said second transistor.

4. An FM receiver according to any one of claims 1 to 3, further comprising a phase-lock loop circuit which is so constructed as to generate said 38 KHz sub-carrier signal which is substantially in synchronism with 19 KHz pilot signal of said stereo composite signal.

* * * * *